US 6,670,716 B2

(12) United States Patent
Christensen et al.

(10) Patent No.: US 6,670,716 B2
(45) Date of Patent: Dec. 30, 2003

(54) SILICON-ON-INSULATOR (SOI) SEMICONDUCTOR STRUCTURE FOR IMPLEMENTING TRANSISTOR SOURCE CONNECTIONS USING BURIED DUAL RAIL DISTRIBUTION

(75) Inventors: Todd Alan Christensen, Rochester, MN (US); John Edward Sheets, II, Zumbrota, MN (US); Gregory John Uhlmann, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/225,914

(22) Filed: Aug. 22, 2002

(65) Prior Publication Data

US 2003/0170936 A1 Sep. 11, 2003

Related U.S. Application Data

(62) Division of application No. 10/092,748, filed on Mar. 7, 2002, now Pat. No. 6,498,057.

(51) Int. Cl.$^7$ ............................................... H01V 23/48
(52) U.S. Cl. ....................... 257/762; 257/764; 257/347; 257/57
(58) Field of Search ................................. 257/762–764, 257/57, 60, 61, 347, 316, 621–623, 349, 628, 350–357

(56) References Cited

U.S. PATENT DOCUMENTS

| 5,889,306 | A | | 3/1999 | Christensen et al. | |
| 6,121,659 | A | * | 9/2000 | Christensen et al. | ........ 257/347 |
| 6,287,901 | B1 | | 9/2001 | Christensen et al. | |
| 6,429,074 | B2 | * | 8/2002 | Lee et al. | .................... 438/259 |
| 6,441,435 | B1 | * | 8/2002 | Chan | ........................ 257/347 |

* cited by examiner

Primary Examiner—Carl Whitehead, Jr.
Assistant Examiner—Yennhu B Huynh
(74) Attorney, Agent, or Firm—Joan Pennington (57) ABSTRACT

Silicon-on-insulator (SOI) semiconductor structures are provided for implementing transistor source connections for SOI transistor devices using buried dual rail distribution. A SOI semiconductor structure includes a SOI transistor having a silicide layer covering a SOI transistor source, a predefined buried conduction layer to be connected to a SOI transistor source, and an intermediate conduction layer between the SOI transistor and the predefined buried conduction layer. A first hole for a transistor source connection to a local interconnect is anisotropically etched in the SOI semiconductor structure to the silicide layer covering the SOI transistor source. A second hole aligned with the local interconnect hole is anisotropically etched through the SOI semiconductor structure to the predefined buried conduction layer. An insulator is disposed between the second hole and the intermediate conduction layer. A conductor is deposited in the first and second holes to create a transistor source connection to the predefined buried conduction layer in the SOI semiconductor structure.

8 Claims, 8 Drawing Sheets

SILICON-ON-INSULATOR (SOI) SEMICONDUCTOR STRUCTURE FOR IMPLEMENTING TRANSISTOR SOURCE CONNECTIONS USING BURIED DUAL RAIL DISTRIBUTION

This application is a divisional application of Ser. No. 10/092,748 filed on Mar. 7, 2002, now U.S. Pat. No. 6,498,057.

FIELD OF THE INVENTION

The present invention relates to methods and silicon-on-insulator (SOI) semiconductor structures for implementing transistor source connections using buried dual rail distribution.

DESCRIPTION OF THE RELATED ART

Fabricating smaller, more densely packed devices having greater computing capability is a continuing objective in building semiconductor devices. Silicon-on-insulator (SOI) technology is an enhanced silicon technology currently being utilized to increase the performance of digital logic circuits. By utilizing SOI technology designers can increase the speed of digital logic integrated circuits or can reduce their overall power consumption. These advances in technology are leading to the development of more complex and faster computer integrated circuits that operate with less power.

Silicon on insulator technology incorporates a buried insulator just below the transistors. Performance of silicon on insulator transistors is increased due to reduced diffusion capacitance and due to the floating body effect resulting in lower threshold voltages as compared to bulk silicon devices.

It is necessary to connect transistor source terminals to a power rail, ground GND or VDD in building semiconductor structure for silicon-on-insulator (SOI) transistor devices. Traditionally, in bulk silicon devices transistor source terminal connections are accomplished by using metal wires surrounded by oxide above the field effect transistors (FETs). These wires are then connected to the source terminals using vertical studs made of electrically conducting material. The power wires consume significant area on the semiconductor structure metal levels.

U.S. Pat. No. 5,889,306, issued Mar. 30, 1999 to Christensen et al., and assigned to the present assignee, discloses a semiconductor device including a conductive substrate, an insulator layer, a silicon layer doped with impurities and forming a first transistor and a second transistor, an isolation volume between the first transistor and the second transistor, and a conductive stud extending from the doped silicon layer to the substrate. One exemplary embodiment uses the bulk silicon substrate as a ground or power source for a semiconductor device such as a field effect transistor (FET). In a more preferred mode, a highly doped substrate is used, fabricated from a bulk silicon wafer of typical thickness. The substrate may function as either a ground plane or a power source, (such as a Vdd plane). In this manner, the substrate eliminates a very large percentage of the metal wiring used for power distribution. For example, the majority of ground wires are eliminated by connecting all electrically grounded transistor devices to the bulk silicon substrate. This connection may be made with a buried conductive stud. The conductive stud generally extends from the active silicon layer through the insulator layer to electrically contact the thick, low resistivity bulk silicon substrate below. With silicon on insulator (SOI) technology, traditional processing techniques may be used throughout fabrication of the device. The resulting device comprises electrical connections between the respective transistor regions and the highly conductive bulk silicon substrate. In turn, the substrate functions as a low resistance conductor between the devices. A single metal connection from an external ground or power source to the substrate may be used for multiple devices. The density of wiring across the surface of the device may also be reduced by a connection every several millimeters across the device surface which reduces the wires previously used for ground or power distribution.

U.S. Pat. No. 6,121,659, issued Sep. 19, 2000 to Christensen et al., and assigned to the present assignee, discloses a semiconductor-on-insulator integrated circuit with buried patterned layers as electrical conductors for discrete device functions, thermal conductors, and/or decoupling capacitors. A SOI semiconductor device has a conductive silicon substrate with a first volume doped with an n+ type dopant and a second volume doped with a p+ type dopant, an insulator layer of silicon dioxide, a silicon layer doped with impurities forming a first transistor and a second transistor having an isolation volume between the first transistor and the second transistor. A first conductive stud electrically connects the first transistor to the first volume. A second conductive stud electrically connects the second transistor to the second volume. Ground wires can be eliminated by connecting all electrically grounded transistor devices to the bulk silicon substrate using a buried conductive stud. The conductive stud generally extends from the active silicon layer through the insulator layer to electrically contact the thick, low resistivity bulk silicon substrate below. Thermal conductance is provided to reduce heating effects which reduce the switching speeds of active devices, such as transistors. Decoupling capacitance is provided between buried layers having different dopants and, hence, different voltage levels.

U.S. Pat. No. 6,287,901, issued Sep. 11, 2001 to Christensen et al., and assigned to the present assignee, discloses a method and semiconductor structure for implementing dual plane body contacts for silicon-on-insulator (SOI) transistors. A bulk silicon substrate is provided A deep ion implant layer is implanted to reside below an oxide insulator. An oxygen implant layer is implanted while applying a mask to block the oxygen implant layer in selected regions. The selected regions provide for body contact for the SOI transistors. Holes are formed extending into the deep ion implant layer and the bulk silicon substrate. The holes are filled with an electrically conductive material to create stud contacts to the deep ion implant layer and the bulk silicon substrate.

A need exists for an effective mechanism in building SOI technology semiconductor structures for fabricating transistor source terminal connections to GND or VDD and that reduces the required area on the semiconductor structure metal levels.

SUMMARY OF THE INVENTION

Principal objects of the present invention are to provide an improved method and semiconductor structure for implementing transistor source connections for silicon-on-insulator (SOI) transistor devices. Other important objects of the present invention are to provide such method and semiconductor structure for implementing transistor connections substantially without negative effect and that overcome many of the disadvantages of prior art arrangements.

In brief, methods and silicon-on-insulator (SOI) semiconductor structures are provided for implementing transistor source connections for SOI transistor devices using buried dual rail distribution. A SOI semiconductor structure includes a SOI transistor having a silicide layer covering a SOI transistor source, a predefined buried conduction layer to be connected to a SOI transistor source, and an intermediate conduction layer between the SOI transistor and the predefined buried conduction layer. A first hole for a transistor source connection to a local interconnect is anisotropically etched in the SOI semiconductor structure to the silicide layer covering the SOI transistor source. A second hole aligned with the local interconnect hole is anisotropically etched through the SOI semiconductor structure to the predefined buried conduction layer. An insulator is disposed between the second hole and the intermediate conduction layer. A conductor is deposited in the first and second holes to create a transistor source connection to the predefined buried conduction layer in the SOI semiconductor structure.

In one method of the invention, a thin layer of insulator is deposited over an interior of the etched holes. The deposited thin insulator layer is anisotropically etched to remove the deposited thin insulator layer from the bottom of the holes exposing the predefined buried conduction layer in the SOI semiconductor structure with the thin insulator layer covering sidewalls of the holes to provide the insulator between the second hole and the intermediate conduction layer.

In another method of the invention, the SOI semiconductor structure includes a patterned buried oxide implant in the intermediate buried conduction layer, the second hole is etched through the patterned buried oxide implant and the conductor is insulated from the intermediate buried conduction layer by the patterned buried oxide implant.

A silicon-on-insulator (SOI) semiconductor structure for implementing source transistor connections for SOI transistor devices using buried dual rail distribution. A first etched hole extends to a silicide layer covering the transistor source. A second etched hole aligned with the first etched hole extends through the SOI semiconductor structure to a predefined buried conduction layer. A conductor extending through the etched holes connects a transistor source to the predefined buried conduction layer in the SOI semiconductor structure.

In one embodiment of the SOI semiconductor structure, the conductor is insulated from another buried conduction layer above the predefined buried conduction layer by an insulator layer covering sidewalls of the etched hole.

In another embodiment of a SOI semiconductor structure, the etched hole extends through a patterned buried oxide implant and the conductor is insulated from another buried conduction layer above the predefined buried conduction layer by the patterned buried oxide implant.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

Having reference now to the drawings, in FIGS. 1–7, there are shown exemplary processing steps for silicon-on-insulator (SOI) transistor source connections for SOI transistor devices in accordance with a first preferred embodiment. In accordance with features of the invention, SOI source connections for SOI transistor devices are fabricated through the SOI semiconductor structure to a predefined buried conduction layer without making electrical connection to an intermediate conduction layer and without requiring connections a first metal level.

Figure 1:
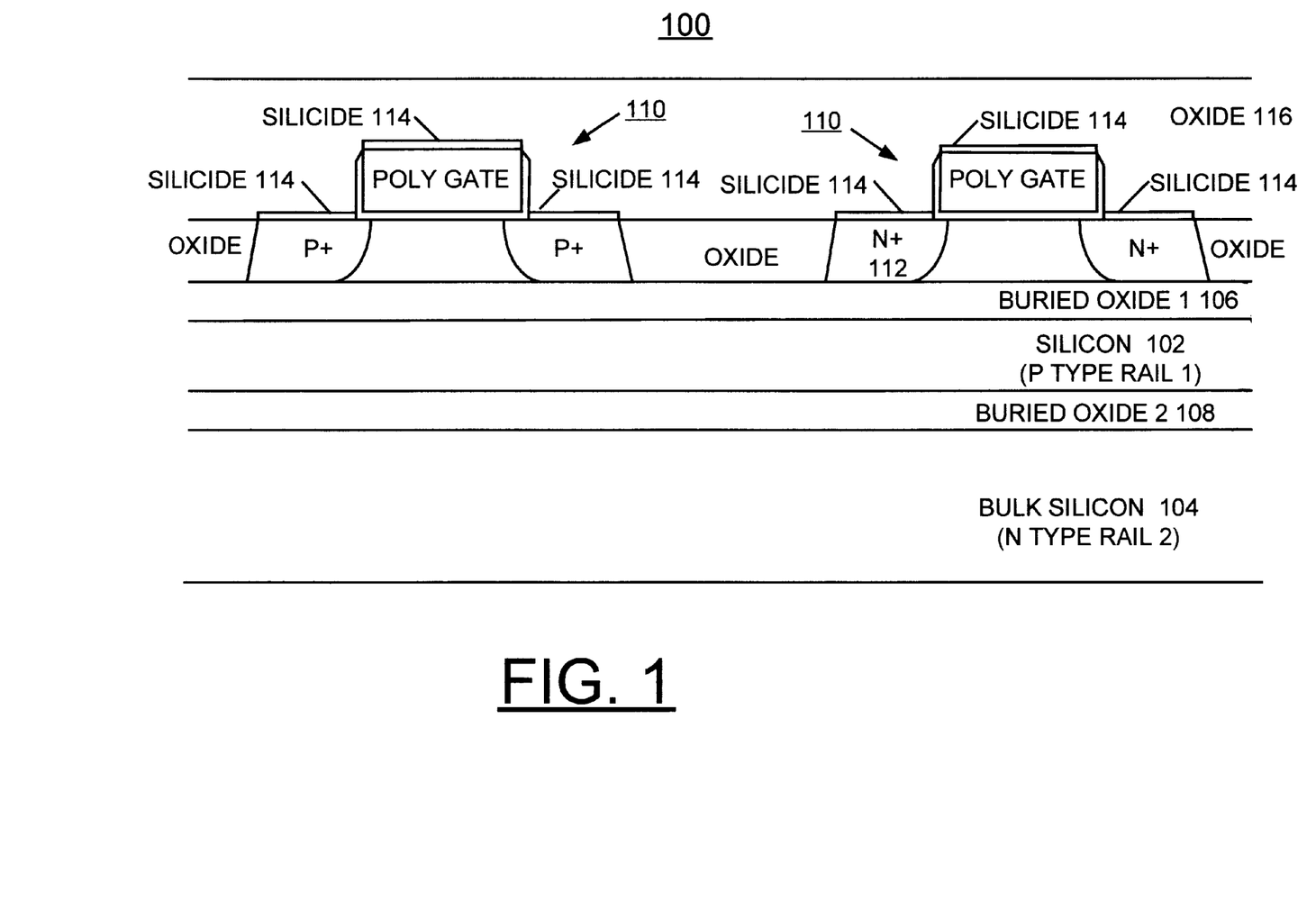
FIGS. 1–7 are schematic cross-sectional views illustrating exemplary processing steps for implementing silicon-on-insulator (SOI) transistor source connections for SOI transistor devices in accordance with a first preferred embodiment.

Referring to FIG. 1, processing begins with a SOI semiconductor structure generally designated by 100 in accordance with a first preferred embodiment. SOI semiconductor structure 100 includes a silicon layer 102 (P type power rail 1) and a bulk silicon substrate layer 104 (N type power rail 2). SOI semiconductor structure 100 includes a first buried oxide 1 106 above the silicon layer 102 (P type power rail 1) and a second buried oxide 2 108 between the dual buried conduction layers 102 and 104. As shown in FIG. 1, SOI semiconductor structure 100 includes a pair of transistors 110 on top of the buried oxide 1 layer 106. The SOI transistors 110 include a source diffusion 112, a body, a gate oxide, a gate polysilicon (POLY GATE), a device isolation oxide (OXIDE), and the like formed by conventional transistor fabrication processes. A silicide layer 114 covers the transistors 110 and an additional oxide layer 116 has been deposited above the transistors 110.

Figure 6:
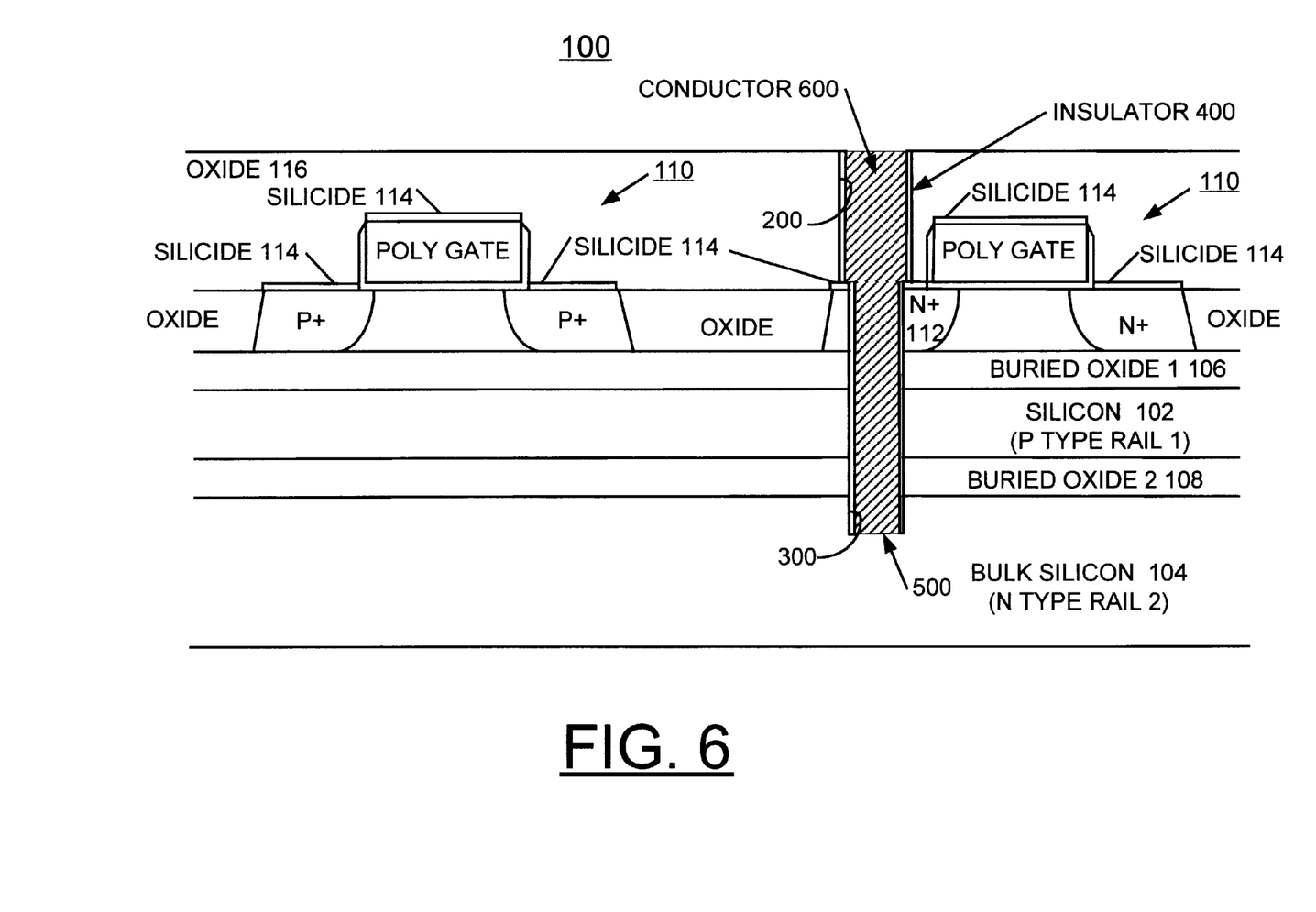
Figure 7:
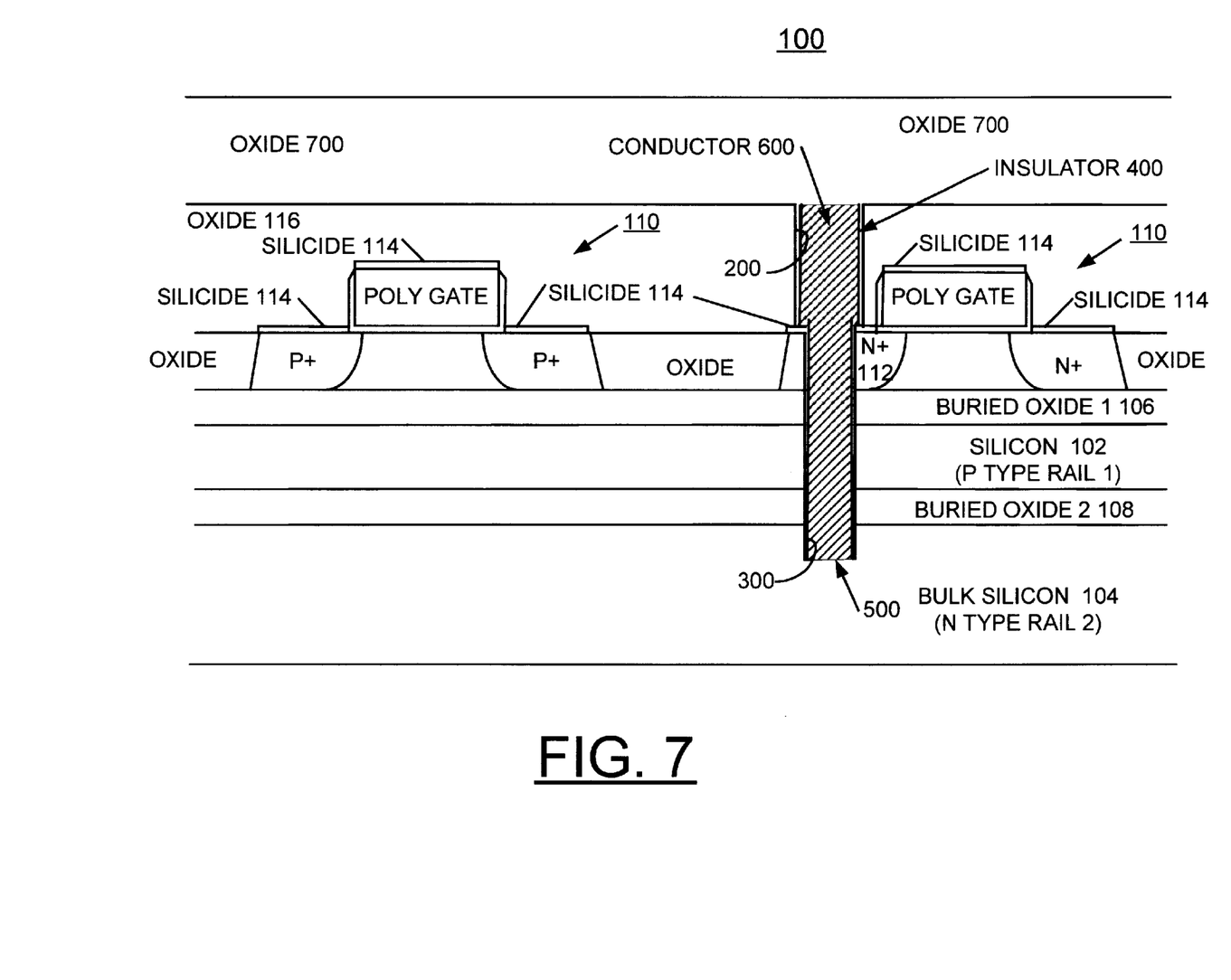
Figure 8:
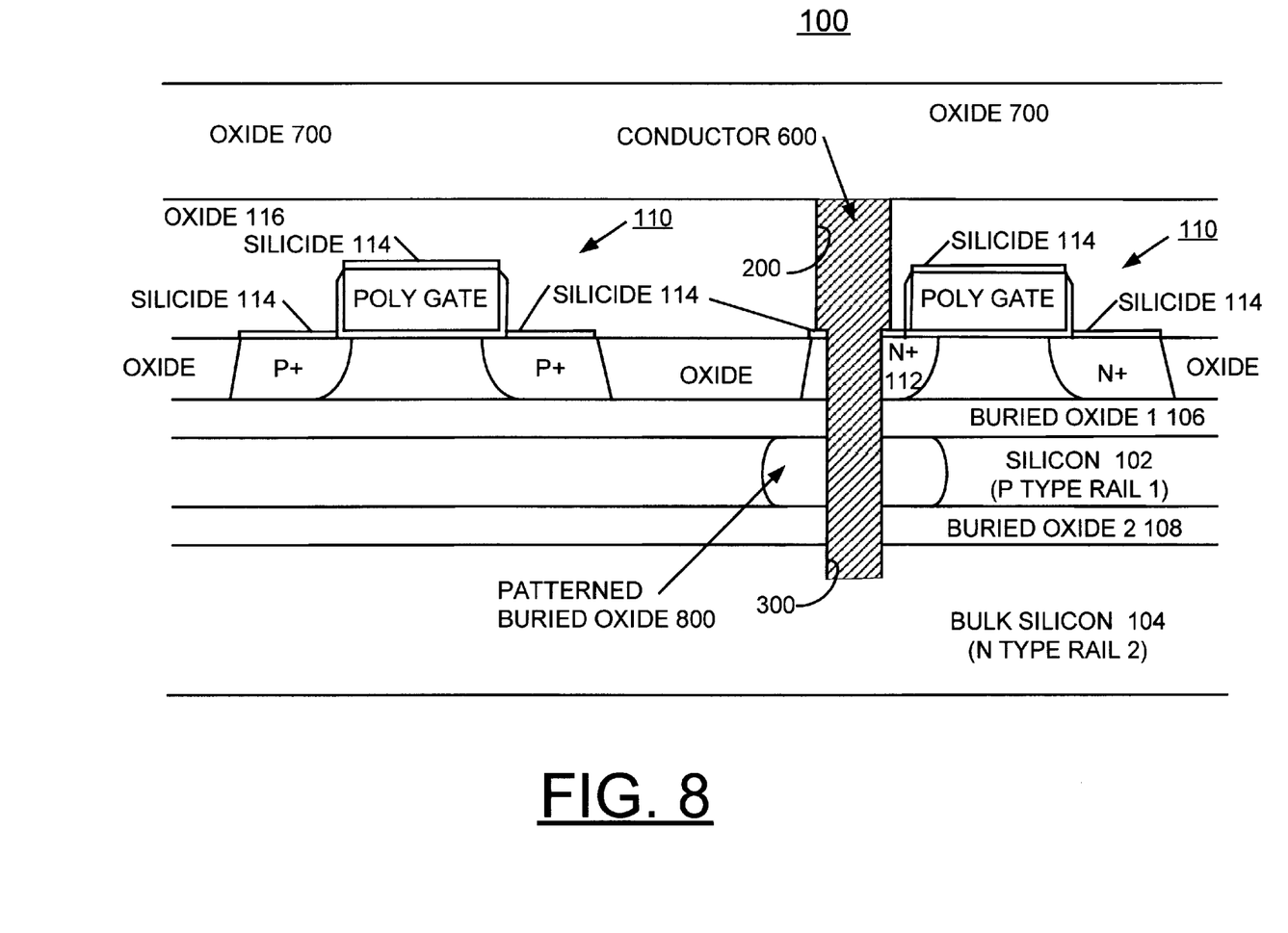
FIG. 8 is a schematic cross-sectional view illustrating another embodiment of a SOI semiconductor structure for implementing silicon-on-insulator (SOI) transistor source connections for SOI transistor devices in accordance with a second preferred embodiment.

It should be understood that the present invention is not limited to the SOI semiconductor structures 100 as shown in FIGS. 1–7 and in FIG. 8. For example, it should be understood that while an oxide layer 116 is shown above the transistors 110, other insulator or dielectric material could be used it should be understood that a P type bulk silicon layer 104 and N type immediate silicon layer 102 could be used to create a structure of the invention.

In FIGS. 1–7 and in FIG. 8, SOI semiconductor structure 100 is shown in simplified form sufficient for understanding the present invention. FIGS. 1–7 and 8 illustrate processing steps to establish a source connection of an N-channel field effect transistor (NFET) to a buried conduction layer of N type material. It should be understood that the same methods are applied to establish a source connection of a P-channel field effect transistor (PFET) to a buried conduction layer of P type material.

Figure 2:
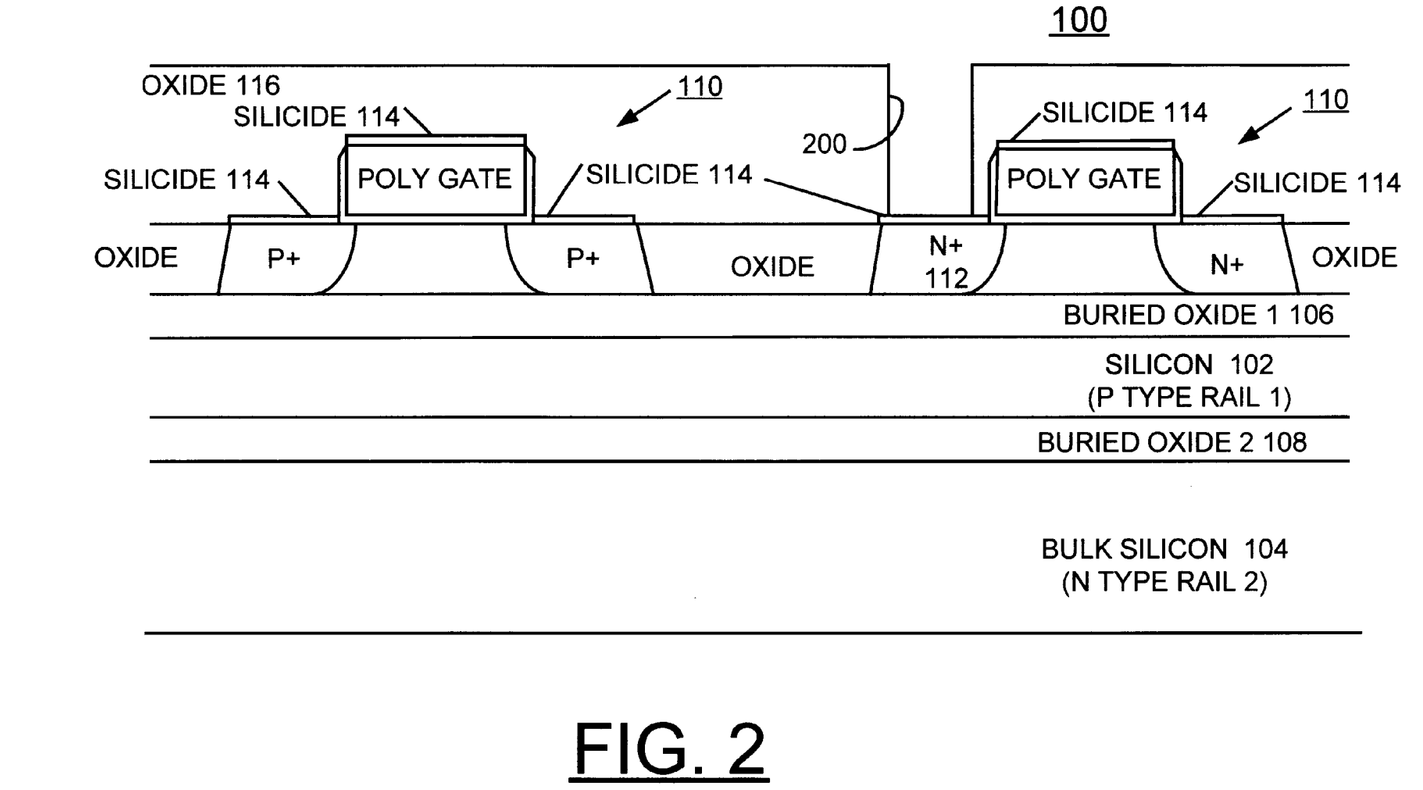

Referring to FIG. 2, then a first hole 200 for local interconnect is anisotropically etched through oxide layer 116 of the SOI semiconductor structure 100 and stops on the silicide layer 114 above the SOI source diffusion 112. The hole 200 is provided for SOI source diffusion connection to a metal local interconnect MC or a metal contact CA that extends between a first level metal and the local interconnect MC. The location for hole 200 is defined by conventional photoresist technique. Etching is done with an anisotropic etch process, for example, a reactive ion etch (RIE) process using plasma etchants.

Figure 3:
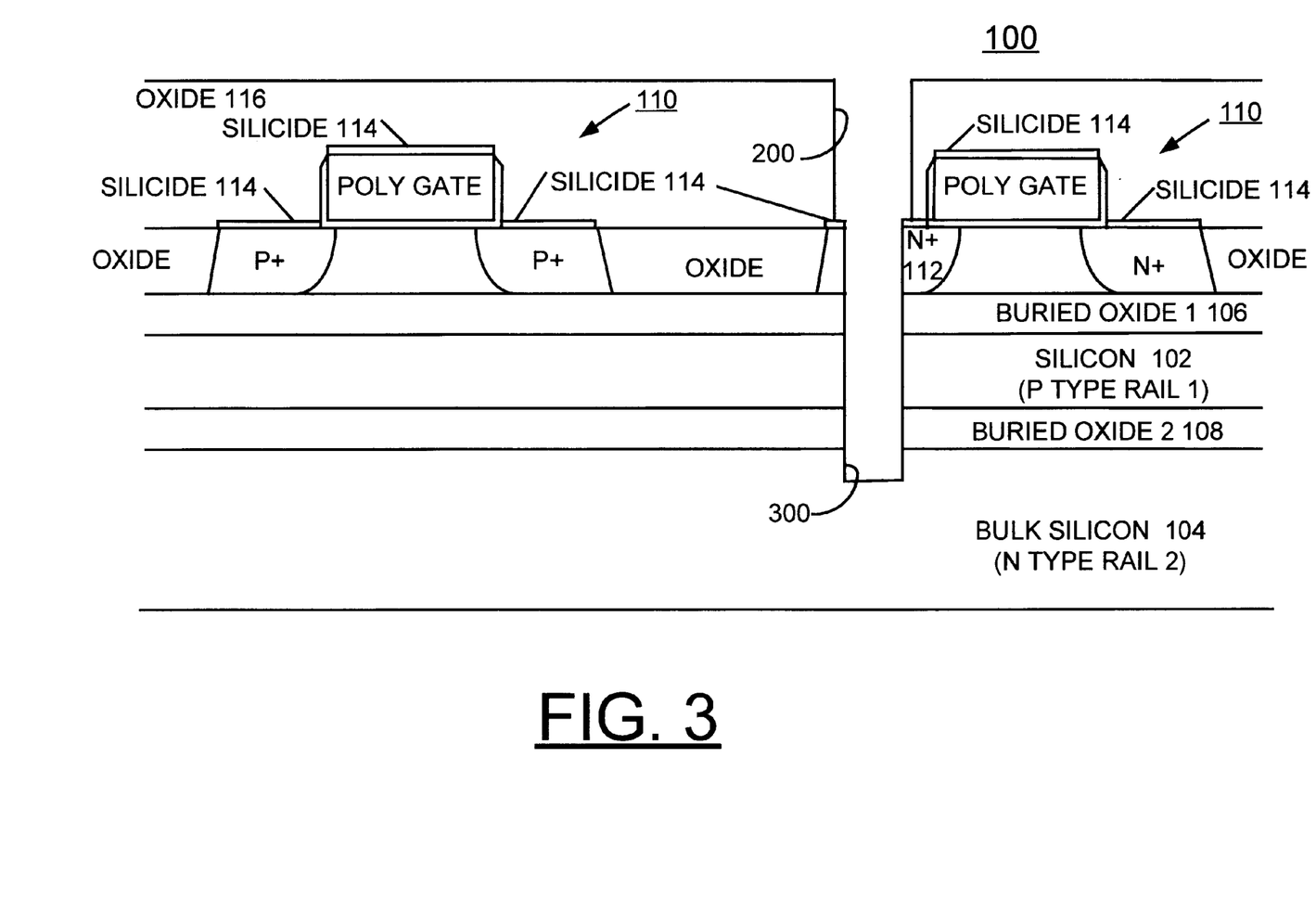

Referring to FIG. 3, then a second hole 300 aligned with the hole 200 for local interconnect is anisotropically etched through the SOI semiconductor structure 100 and stops on the buried bulk silicon conduction layer 104 (N type power rail 2) that is the desired connection for the SOI source 112. Looking down into the second hole 300, the area of the second hole 300 must be a subset of hole 200 for local interconnect. The elongate hole 300 is anisotropically etched through the silicide layer 114, the SOI source 112, first buried oxide 106, the intermediate buried conduction layer 102 (P type power rail 1), second buried oxide 108 to the lower buried conduction layer 104 (N type power rail 2). Etching is done with an anisotropic etch process, for example, a reactive ion etch (RIE) process using plasma etchants. Anisotropic etchants cut directly downwardly through the SOI semiconductor structure 100 to the lower buried conduction bulk silicon substrate layer 104 (N type power rail 2) substantially without any additional etching in the horizontal plane.

Figure 4:
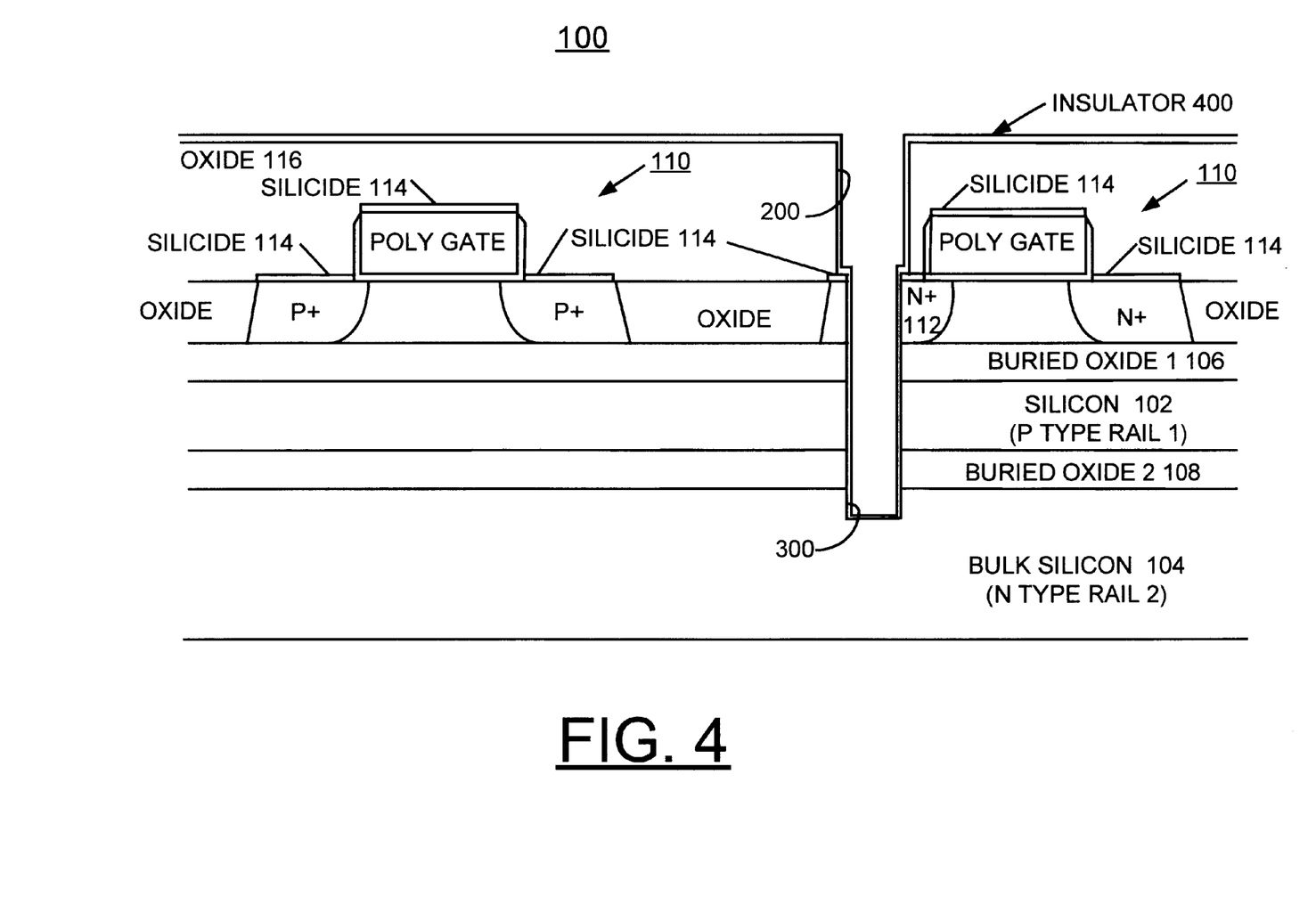

Referring to FIG. 4, a thin layer of insulator 400 is conformally deposited covering the interior of the holes 200, 300 and a top surface of the oxide layer 116. For example, the deposited thin insulator layer 400 typically is much thinner than the oxide layers 106, 108, 116. The deposited thin insulator layer 400 has a substantially uniform thickness generally less than 10% of the diameter of the hole 300. The deposited thin insulator layer 300 has a thickness, for example, in a range of 50–500 angstroms.

Figure 5:
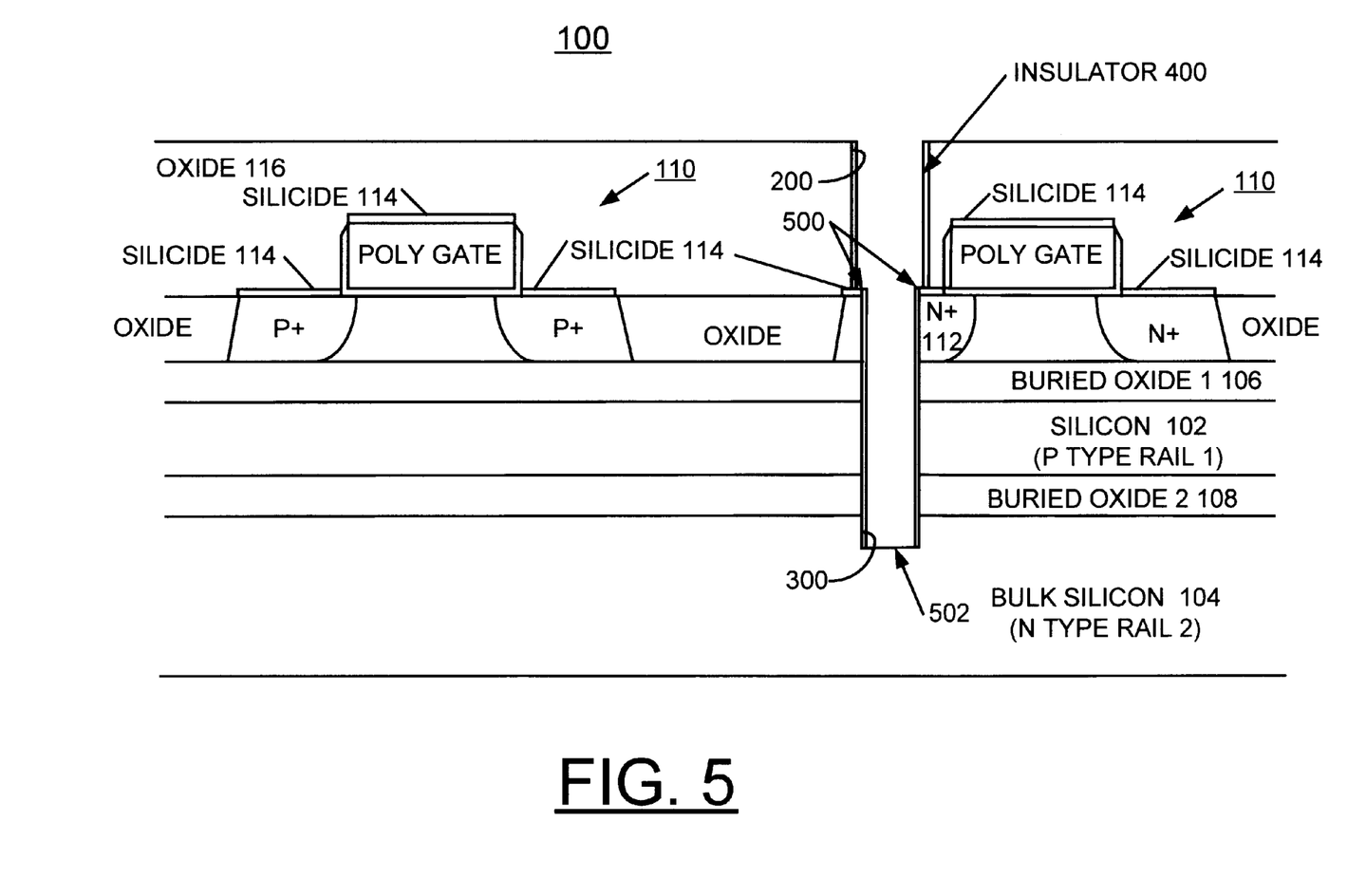

Referring to FIG. 5, a short anisotropic etch of the deposited insulator 400 is performed so that insulator 400 is left only along the sidewalls of the holes 200, 300. The deposited thin insulator 400 is etched away along a respective bottom 500 and 502 of the holes 200, 300 exposing the silicide 114 over the source 112 and exposing the buried conduction bulk silicon substrate layer 104 (N type power rail 2) and is etched away the top surface of the oxide 116. The anisotropic etching removes the deposited thin insulator 400 from the flat bottom portions 500, 502 of the holes 200, 300 and the flat top surface of the oxide 116 with a reactive ion etch (RIE) process using an appropriate plasma etchant.

Referring to FIG. 6, a conductor 600, typically tungsten is deposited within the insulated opening defined by holes 200, 300. Conductor 600 is formed of an electrically conductive material selected from the group including, for example, copper, conductive doped silicon, platinum, palladium, rhodium, aluminum, tantalum, titanium, tungsten and titanium-tungsten. Conductor 600 is deposited, for example, by conventional sputtering, evaporation, or chemical vapor deposition (CVD) processes so as to fill in the insulated holes. Conductor 600 forms a conductive path from the SOI source diffusion 112 to the buried conduction bulk silicon substrate layer 104 (N type power rail 2). The metal conductor 600 is polished, for example, using a conventional chemical-mechanical polishing process, to be level with the oxide layer.

Referring to FIG. 7, a layer of oxide 700 is deposited over the oxide 116, conductor 600 and insulator 400. Normal processing then continues that includes depositing metal layers, and can include connecting metal to the conductor 600.

FIG. 8 illustrates another embodiment of a SOI semiconductor structure for implementing silicon-on-insulator (SOI) transistor source connections for SOI transistor devices in accordance with a second preferred embodiment. In FIG. 8, the same reference numbers are used for identical or similar components of the SOI semiconductor structure as used in FIGS. 1–7.

Referring to FIG. 8, a patterned buried oxide implant 800 is provided in the silicon layer 102 (P type rail 1) aligned with the hole 300 to be etched. The first hole is etched as shown in FIG. 2, then the second hole 300 is etched through the silicide layer 114, the SOI source 112, the first buried oxide 106, the patterned buried oxide implant 800 in the intermediate buried conduction layer 102 (P type power rail 1), the second buried oxide 108 to the lower buried conduction layer 104 (N type power rail 2). Since the hole 300 is etched through the patterned buried oxide layer 800, there is no need for a sidewall insulator inside the holes 200, 300 so that the processing steps illustrated in FIGS. 4 and 5 are eliminated. The conductor is deposited in the holes 200, 300 as shown in FIG. 6. Conductor 600 forms a conductive path from the SOI source diffusion 112 to the buried conduction bulk silicon substrate layer 104 (N type power rail 2). As shown in FIG. 8, with the sidewall insulator inside the holes 200, 300 eliminated, more surface area and a larger conduction path between the source diffusion 112 and the lower buried conduction layer 104 is provided by the conductor 600.

While the present invention has been described with reference to the details of the embodiments of the invention shown in the drawings, these details are not intended to limit the scope of the invention as claimed in the appended claims.

What is claimed is:

1. A SOI semiconductor structure for implementing silicon-on-insulator (SOI) transistor source connections for SOI transistor devices using buried duel rail distribution comprising:

a SOI transistor having a silicide layer covering a SOI transistor source diffusion, a first predefined buried conduction layer, and a second predefined buried conduction layer below said first predefined buried conduction layer, a first buried oxide layer above said first predefined buried conduction layer, and a second buried oxide layer between said first predefined buried conduction layer and said second predefined buried conduction layer;

a first etched hole extending through a first portion of said SOI semiconductor structure to said silicide layer covering said SOI transistor source diffusion;

a second etched hole aligned with said first hole extending through a second portion of said SOI semiconductor structure to said second predefined buried conduction layer, said second etched hole extending through said first predefined buried conduction layer to said second predefined buried conduction layer;

an insulator separating said second etched hole and said first predefined buried conduction layer; and a conductor extending through said first and second holes and connecting said transistor source diffusion to said second predefined buried conduction layer in the SOI semiconductor structure.

2. A SOI semiconductor structure for implementing silicon-on-insulator (SOI) transistor source connections for SOI transistor devices as recited in claim 1 wherein said insulator separating said second etched hole and said first predefined buried conduction layer includes an insulator layer covering a sidewall of said second hole.

3. A SOI semiconductor structure for implementing silicon-on-insulator (SOI) transistor source connections for SOI transistor devices as recited in claim 1 wherein said insulator separating said second etched hole and said first predefined buried conduction layer includes a patterned oxide implant in said first predefined buried conduction layer and said second etched hole extending through said patterned oxide implant.

4. A SOI semiconductor structure for implementing silicon-on-insulator (SOI) transistor source connections for SOI transistor devices as recited in claim 1 wherein said SOI transistor is an N-channel field effect transistor, and said second predefined buried conduction layer in the SOI semiconductor structure comprising N type bulk silicon material.

5. A SOI semiconductor structure for implementing silicon-on-insulator (SOI) transistor source connections for SOI transistor devices as recited in claim 1 wherein said SOI transistor is a P-channel field effect transistor, and said second predefined buried conduction layer in the SOI semiconductor structure comprising P type bulk silicon material.

6. A SOI semiconductor structure for implementing silicon-on-insulator (SOI) transistor source connections for SOI transistor devices as recited in claim 1 wherein said second predefined buried conduction layer in the SOI semiconductor structure defines a ground or a power source.

7. A SOI semiconductor structure for implementing silicon-on-insulator (SOI) transistor source connections for SOI transistor devices as recited in claim 1 wherein said conductor is formed of tungsten.

8. A SOI semiconductor structure for implementing silicon-on-insulator (SOI) transistor source connections for SOI transistor devices as recited in claim 1 wherein said conductor is formed of an electrically conductive material selected from the group including copper, conductive doped silicon, platinum, palladium, rhodium, aluminum, tantalum, titanium, tungsten and titanium-tungsten.

* * * * *